(12) United States Patent
Tseng

(10) Patent No.: US 8,222,542 B2
(45) Date of Patent: Jul. 17, 2012

(54) SHIELDING ASSEMBLY

(75) Inventor: Kuan-Chih Tseng, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 264 days.

(21) Appl. No.: 12/759,695

(22) Filed: Apr. 13, 2010

(65) Prior Publication Data

US 2011/0226522 A1 Sep. 22, 2011

(30) Foreign Application Priority Data

Mar. 16, 2010 (CN) ...................... 2010 2 0133520 U

(51) Int. Cl.
*H05K 9/00* (2006.01)
(52) U.S. Cl. .................... 174/382; 174/384; 361/816
(58) Field of Classification Search .................. 174/382, 174/377, 384; 361/816
See application file for complete search history.

(56) References Cited

U.S. PATENT DOCUMENTS

| | | | |
|---|---|---|---|
| 3,721,746 A * | 3/1973 | Knappenberger | 174/372 |
| 4,754,101 A * | 6/1988 | Stickney et al. | 174/383 |
| 5,014,160 A * | 5/1991 | McCoy, Jr. | 361/818 |
| 5,043,848 A * | 8/1991 | Rogers et al. | 361/816 |
| 5,354,951 A * | 10/1994 | Lange et al. | 174/372 |
| 5,436,802 A * | 7/1995 | Trahan et al. | 361/816 |
| 7,113,410 B2 * | 9/2006 | Pawlenko et al. | 361/818 |
| 7,345,248 B2 * | 3/2008 | Vinokor et al. | 174/382 |
| 7,463,496 B2 * | 12/2008 | Robinson et al. | 361/818 |
| 7,501,587 B2 * | 3/2009 | English | 174/354 |
| 7,504,592 B1 * | 3/2009 | Crotty, Jr. | 174/372 |
| 7,903,431 B2 * | 3/2011 | English et al. | 361/816 |
| 7,926,166 B2 * | 4/2011 | Zuehlsdorf et al. | 29/602.1 |

* cited by examiner

*Primary Examiner* — Hung Ngo
(74) *Attorney, Agent, or Firm* — Altis Law Group, Inc.

(57) ABSTRACT

A shielding assembly includes a frame and a cover mounted on the frame. The frame includes a plurality of first sidewalls, and at least one pair of resilient clips. Each resilient clip includes a protruding portion protruding from an exterior surface of a corresponding first sidewall, an extending portion extending from the protruding portion and along the exterior surface of the corresponding first sidewall, and a protrusion protruding from the extending portion and toward the exterior surface of the corresponding first sidewall. The cover includes a plane covering the frame, a plurality of second sidewalls extending perpendicularly from the plane and corresponding to the first sidewalls, at least one pair of stopper portions each protruding from one of second sidewalls and corresponding to one of the resilient clips. Each stopper portion is received between the protruding portion and the protrusion of the corresponding resilient clip.

5 Claims, 6 Drawing Sheets

SHIELDING ASSEMBLY

BACKGROUND

1. Technical Field

The disclosure generally relates to shielding assemblies.

2. Description of Related Art

In order to protect electronic components on a circuit board of an electronic device from electromagnetic interference (EMI), shielding assemblies are generally employed to cover the electronic components. A commonly used shielding assembly is made by punching a metal piece and soldering the punched metal piece to the circuit board. With this structure, to repair the electronic components, the shield must be disassembled from the circuit board with special tools, which is inconvenient and may become damaged and deformed and becomes unusable in the disassembly process the shield.

Therefore, a need exists in the industry to overcome the described limitations.

DETAILED DESCRIPTION

Figure 1:
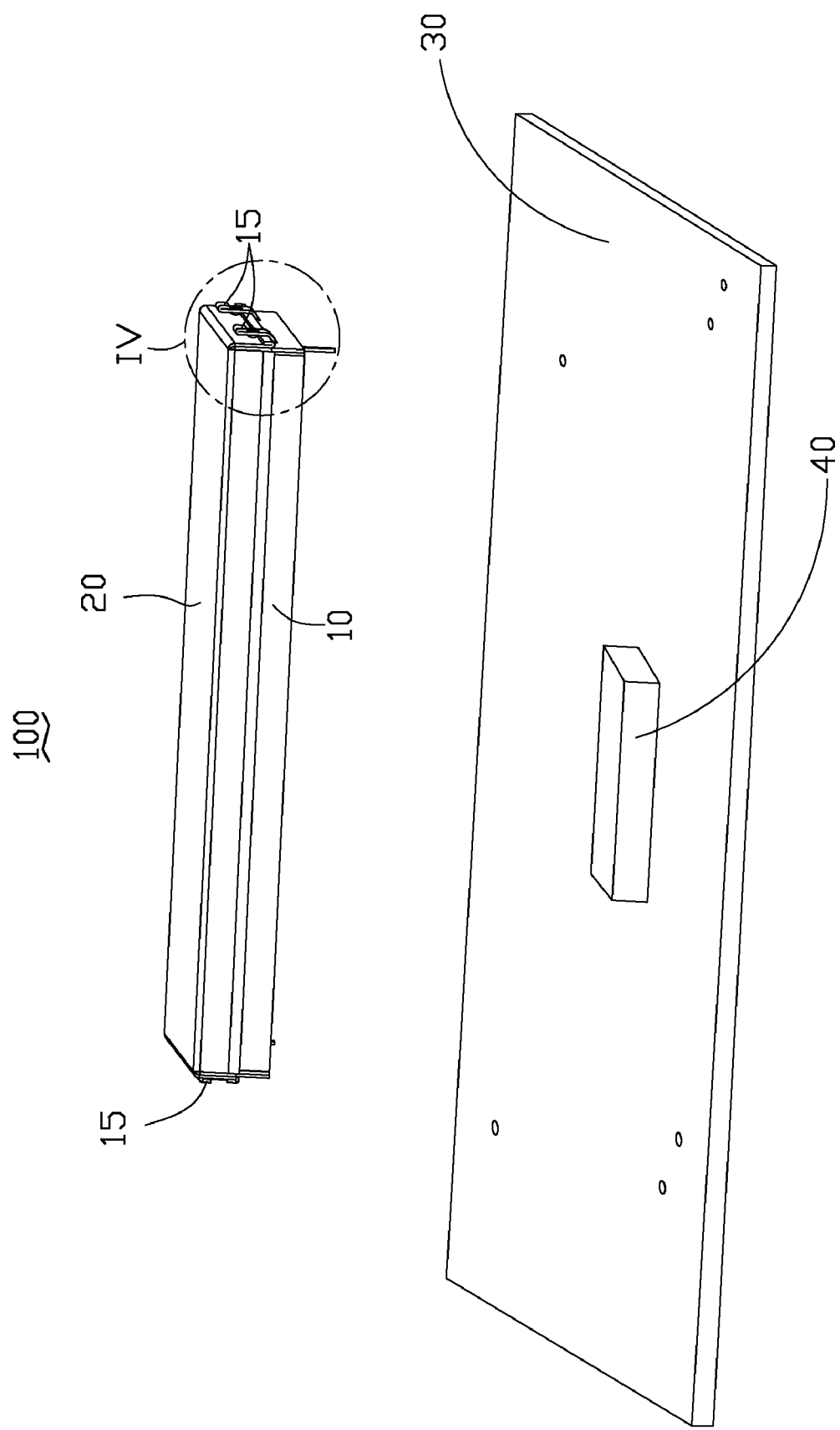
FIG. 1 is a perspective, isometric view of a shielding assembly in accordance with a first embodiment of the disclosure, in which the shielding assembly is mounted to a circuit board to provide protection against electromagnetic interference for an electronic component.
Figure 2:
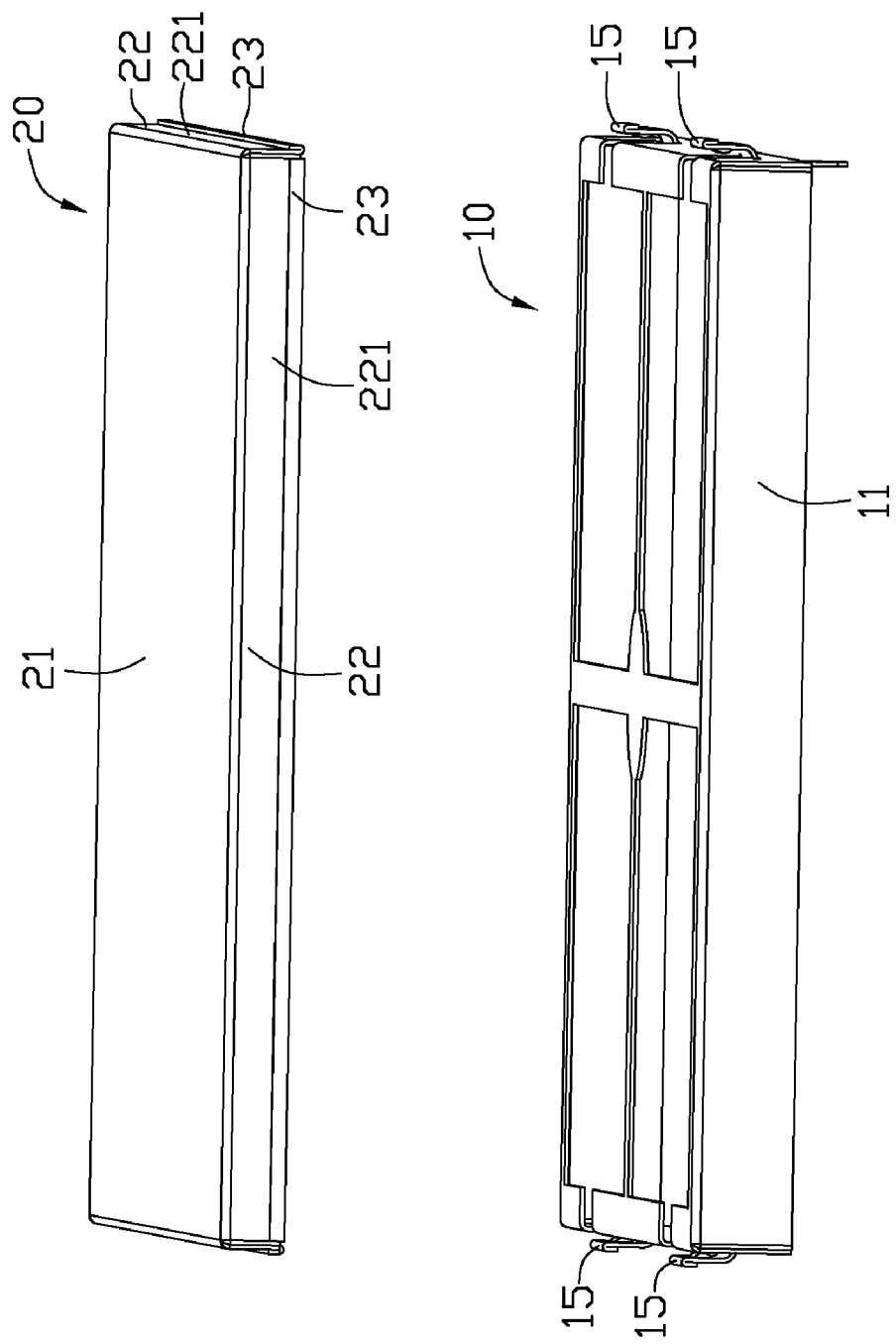
FIG. 2 is an exploded perspective view of the shielding assembly of FIG. 1.

FIG. 1 is a perspective, isometric view of a shielding assembly 100 in accordance with a first embodiment of the disclosure. FIG. 2 is an exploded perspective view of the shielding assembly 100 of FIG. 1. The shielding assembly 100 is mounted to a circuit board 30 to provide protection against electromagnetic interference (EMI) for an electronic component 40 positioned on the circuit board. The shielding assembly 100 comprises a frame 10 fixed on the circuit board, and a cover 20 covering the frame 10.

Figure 3:
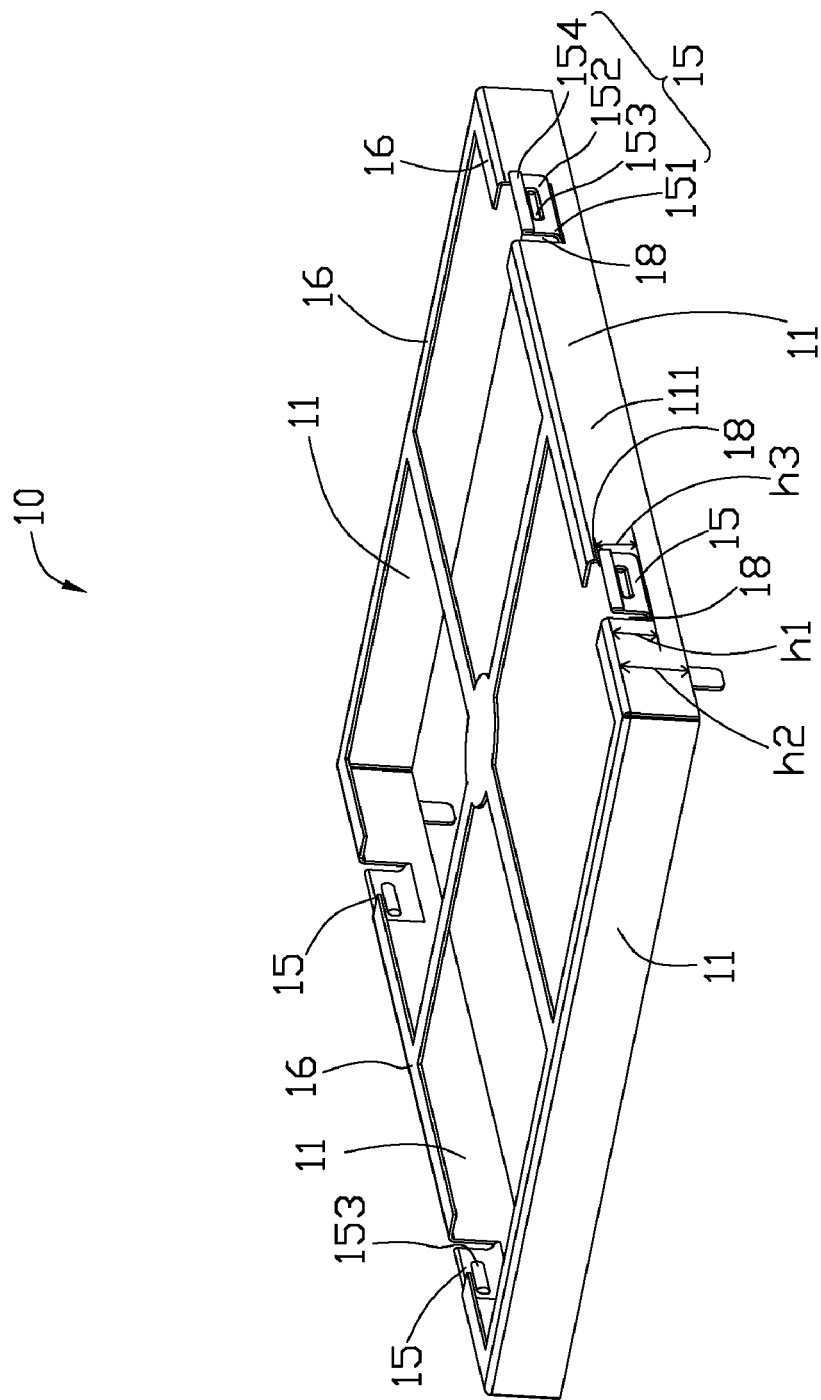
FIG. 3 is a perspective, isometric view of a frame of the shielding assembly of FIG. 1.

With reference to FIG. 3, the frame 10 comprises a plurality of first sidewalls 11 and at least one pair of resilient clips 15; each pair of resilient clips 15 respectively located on two opposite sidewalls of the first sidewalls 11. In the embodiment, the frame 10 comprises two pairs of first sidewalls 11 members of each pair opposite to each other, and each of one pair of the two pairs of first sidewalls 11 is configured with two resilient clips 15.

In the embodiment, the frame 10 further comprises a top wall 16 extending from top edges of the first sidewalls 11 and towards a center of the frame 10.

Figure 4:
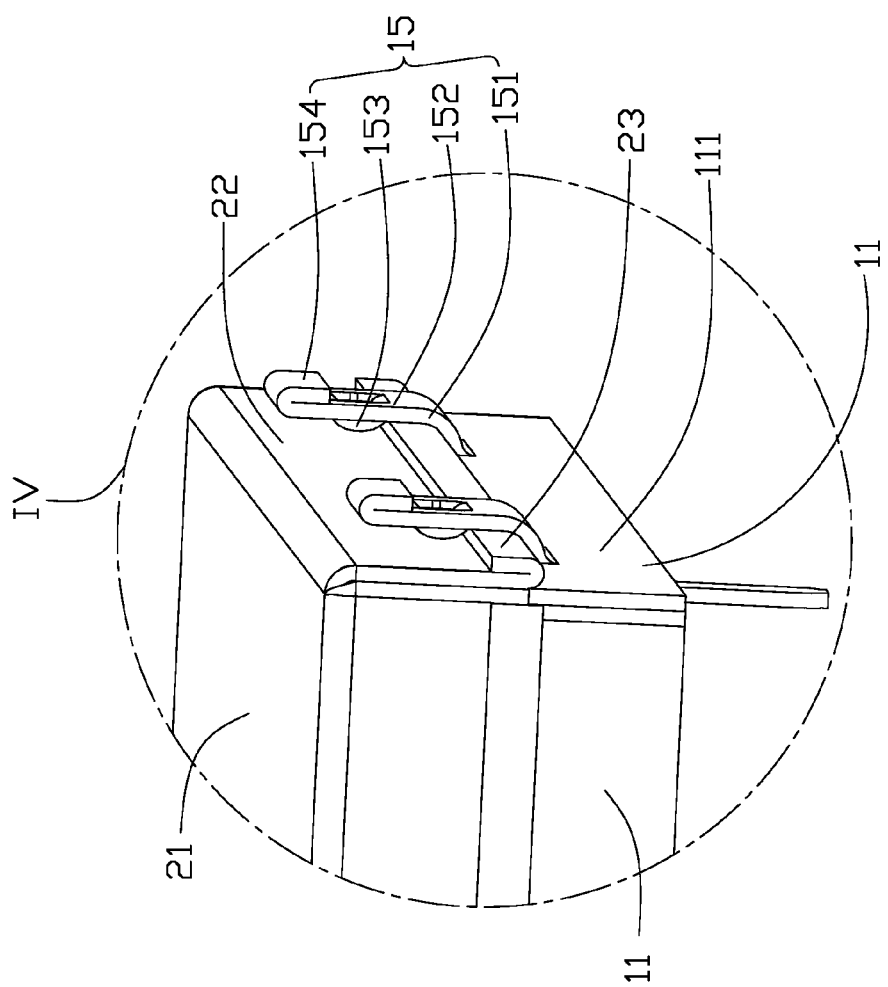
FIG. 4 is an enlarged sectional view of FIG. 1.

Referring to FIG. 3 and FIG. 4, each resilient clip 15 comprises a protruding portion 151, a extending portion 152, a protrusion 153, and a holding portion 154. The protruding portion 151 protrudes from an outer surface 111 of a corresponding first sidewall 11. The extending portion 152 extends from the protruding portion 151 and along the outer surface 111. The protrusion 153 protrudes from the extending portion 152 and toward the corresponding first sidewall 11. The holding portion 154 is the distal end of the clip 15 bent back over itself and is parallel to the corresponding first sidewall 11.

In the embodiment, each resilient clip 15 is formed by punching the corresponding first sidewall 11 and a portion of the top wall 16 so that two gaps 18 are defined on two sides of the resilient clip 15. The gaps 18 improve resilience of the resilient clip 15. In the embodiment, a depth h1 of each gap 18 is substantially equal to a height h3 of the resilient clips 15 and less than a height h2 of the corresponding first sidewalls 11.

The cover 20 comprises a plane 21 covering the frame 10, a plurality of second sidewalls 22 extending perpendicularly from a boundary plane 21 and corresponding to the plurality first sidewalls 11 of the frame 10, and at least one pair of stopper portions 23 corresponding to the at least one pair of resilient clips 15 of the frame 10. Each stopper portion 23 protrudes from an exterior surface 221 of a corresponding one of the second sidewalls 22 and matched with a corresponding resilient clip 15. In the embodiment, each stopper portion 23 extends from edge of the corresponding second sidewall 22 and along the exterior surface 221 of the corresponding second sidewall 22. In other words, the stopper portion 23 is formed by folding the corresponding second sidewall 22 outwardly. In assembly, each of the stopper portions 23 is received between the protruding portion 151 and the protrusion 153 of the corresponding resilient clip 15.

During assembly of the shielding assembly 100, each second sidewall 22 of the cover 20 is inserted between the corresponding resilient clip 15 and the exterior surface 111 of the corresponding first sidewall 11 of the frame 10. Each stopper portion 23 urges the protrusion 153 of the corresponding resilient clip 15, so that the resilient clip 15 extends away from the corresponding sidewall 22 of the cover 20. In this position, the stopper portion 23 is received between the protruding portion 151 and the protrusion 153 of the corresponding resilient clip 15, and the at least one pair of resilient clips 15 retain the cover 20 to the frame 10.

To detach the cover 20 from the frame 10, each resilient clip 15 is flexed outwards with respect to the corresponding second sidewall 22 of the cover 20 by an external force on the holding portion 154. As a result, each stopper portion 23 of the cover 20 is easy to remove from between the protruding portion 151 and the protrusion 153 of the corresponding resilient clip 15, and the cover 20 is detached from the frame 10.

The cover 20 can be detached and attached to the frame 10 easily due to the resilient clips 15 of the frame 10, and the shielding assembly 100 can be used many times, which leads to convenience and low cost repairs to the electronic components.

Figure 5:
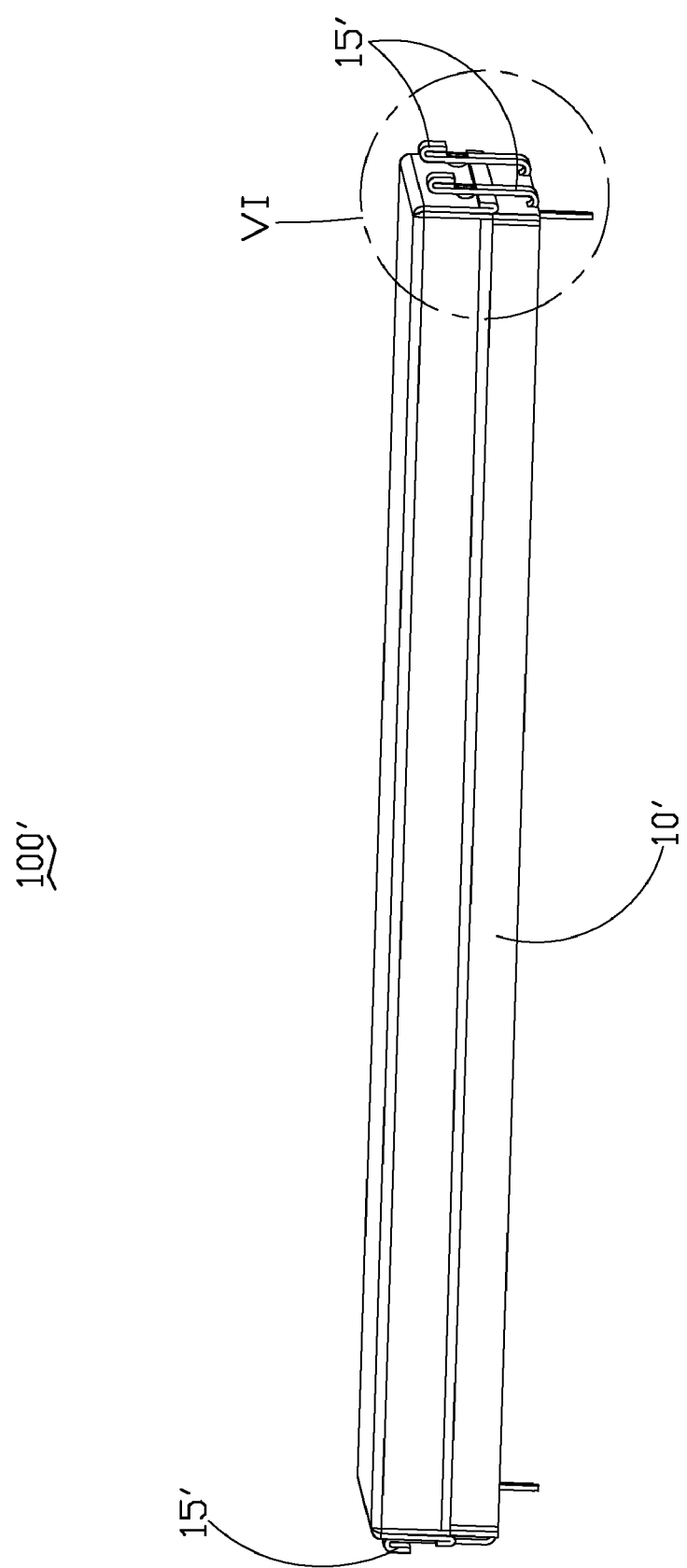
FIG. 5 is a perspective, isometric view of a shielding assembly in accordance with a second embodiment of the disclosure.
Figure 6:
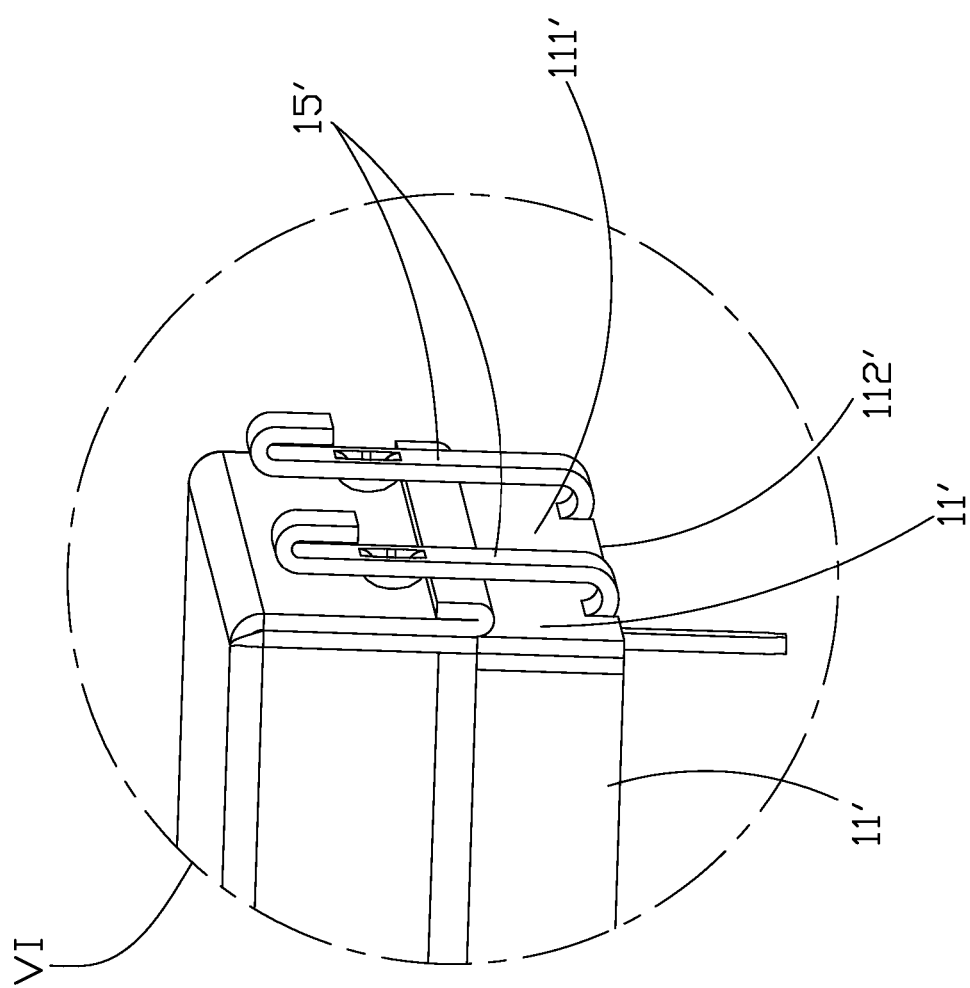
FIG. 6 is an enlarged sectional view of FIG. 5.

FIG. 5 is a perspective, isometric view of a shielding assembly 100' in accordance with a second embodiment of the disclosure. FIG. 6 is an enlarged sectional view of FIG. 5. The shielding assembly 100' has the same configuration and can perform the same function as the shielding assembly 100 shown in FIG. 1, differing in that each resilient clip 15' is protruding from a bottom portion 112' of a corresponding first sidewall 11' of a frame 10' and extending along an exterior surface 111' of the corresponding first sidewall 11'.

While the exemplary embodiments have been described, it should be understood that it has been presented by way of example only and not by way of limitation. The breadth and scope of the disclosure should not be limited by the described exemplary embodiments, but only in accordance with the following claims and their equivalents.

What is claimed is:

1. A shielding assembly, comprising:

a frame comprising a plurality of first sidewalls, and at least one pair of resilient clips, each pair of resilient clips respectively located on two opposite sidewalls of the plurality of first sidewalls, each resilient clip comprising a protruding portion protruding from an exterior surface of a corresponding first sidewall, an extending portion extending from the protruding portion and along the exterior surface of the corresponding first sidewall, and a protrusion protruding from the extending portion and toward the exterior surface of the corresponding first sidewall; and a cover mounted to the frame and comprising a plane covering the frame, a plurality of second sidewalls extending perpendicularly from a boundary of the plane and corresponding to the plurality of the first sidewalls of the frame, at least one pair of stopper portions each protruding from one of the plurality of second sidewalls and corresponding to one of the resilient clips, wherein each stopper portion is received between the protruding portion and the protrusion of the corresponding resilient clip;

wherein when each resilient clip is flexed outwards with respect to the corresponding second sidewall of the cover, each stopper portion is removed from the protruding portion and the protrusion of the corresponding resilient clip, so that the cover is detached from the frame.

2. The shielding assembly as claimed in claim 1, wherein two gaps are defined on two sides of each resilient clip.

3. The shielding assembly as claimed in claim 1, wherein each resilient clip protrudes from the exterior surface of the corresponding first sidewall and along the exterior surface of the corresponding first sidewall.

4. The shielding assembly as claimed in claim 1, wherein each stopper portion extends from edge of a corresponding one of the second sidewalls and extends along an exterior surface of the corresponding second sidewall.

5. The shielding assembly as claimed in claim 1, wherein each resilient clip further comprises a holding portion, and the holding portion is the distal end of the resilient clip bent back over itself.

* * * * *